(12) United States Patent
Abe et al.

(10) Patent No.: US 9,774,005 B2
(45) Date of Patent: Sep. 26, 2017

(54) OPTICAL LAYERED BODY AND SURFACE LIGHT SOURCE DEVICE

(71) Applicant: ZEON CORPORATION, Tokyo (JP)

(72) Inventors: Hana Abe, Tokyo (JP); Toshihide Murakami, Tokyo (JP)

(73) Assignee: ZEON CORPORATION, Tokyo (JP)

(*) Notice: Subject to any disclaimer, the term of this patent is extended or adjusted under 35 U.S.C. 154(b) by 0 days.

(21) Appl. No.: 14/896,046

(22) PCT Filed: Jun. 18, 2014

(86) PCT No.: PCT/JP2014/066206
§ 371 (c)(1),
(2) Date: Dec. 4, 2015

(87) PCT Pub. No.: WO2014/208429
PCT Pub. Date: Dec. 31, 2014

(65) Prior Publication Data
US 2016/0133876 A1    May 12, 2016

(30) Foreign Application Priority Data

Jun. 25, 2013 (JP) ................................. 2013-132993

(51) Int. Cl.
*H01L 51/52* (2006.01)
*B32B 7/02* (2006.01)
(Continued)

(52) U.S. Cl.
CPC ............ *H01L 51/5268* (2013.01); *B32B 7/02* (2013.01); *B32B 7/12* (2013.01); *G02B 5/0242* (2013.01);
(Continued)

(58) Field of Classification Search
None
See application file for complete search history.

(56) References Cited

U.S. PATENT DOCUMENTS

2008/0013177 A1*  1/2008  Hatano ................... G02B 1/111
                                                        359/586
2012/0080710 A1   4/2012  Inoue et al.
2015/0179981 A1   6/2015  Inoue et al.

FOREIGN PATENT DOCUMENTS

EP       2442006 A1      4/2012
JP    2003-131032 A      5/2003
(Continued)

OTHER PUBLICATIONS

Sep. 2, 2014 International Search Report issued in International Patent Application No. PCT/JP2014/066206.
(Continued)

*Primary Examiner* — Fernando L Toledo
*Assistant Examiner* — Valerie N Newton
(74) *Attorney, Agent, or Firm* — Oliff PLC

(57) ABSTRACT

An optical layered body including: a substrate layer; a first adhesive layer disposed on one surface of the substrate layer; and a second adhesive layer disposed on an opposite surface of the first adhesive layer to the substrate layer, wherein the second adhesive layer includes particles that are capable of scattering light, and a refractive index n1 of the first adhesive layer and a refractive index n2 of the second adhesive layer satisfy $1.40 \leq n1 \leq 1.50$, $1.47 \leq n2 \leq 1.85$, and $0 < n2-n1 \leq 0.45$.

8 Claims, 2 Drawing Sheets

(51) Int. Cl.
*G02B 5/02* (2006.01)
*B32B 7/12* (2006.01)

(52) U.S. Cl.
CPC .... *H01L 51/5275* (2013.01); *B32B 2307/418* (2013.01)

(56) References Cited

FOREIGN PATENT DOCUMENTS

| | | | |
|---|---|---|---|
| JP | 2004-155188 A | 6/2004 |
| JP | 2013-029750 A | 2/2013 |
| JP | 2013-077410 A | 4/2013 |
| WO | 2010/143705 A1 | 12/2010 |

OTHER PUBLICATIONS

Dec. 29, 2015 International Preliminary Report on Patentability issued in International Patent Application No. PCT/JP2014/066206.
Feb. 1, 2017 Extended Search Report issued in European Patent Application No. 14817735.5.

\* cited by examiner

OPTICAL LAYERED BODY AND SURFACE LIGHT SOURCE DEVICE

FIELD

The present invention relates to an optical layered body and a surface light source device.

BACKGROUND

An organic electroluminescent element (appropriately referred to hereinbelow as an "organic EL element") includes a light-emitting layer disposed between multiple layers of electrodes thereby to electrically obtain luminescence, and has characteristics such as high luminous efficiency, low voltage drive, low weight, and low cost. Taking advantage of such characteristics, there have been made studies for using the organic EL element as a light source of surface light source devices such as flat-type lighting systems and back lights for liquid crystal display devices.

When the organic EL element is utilized as a light source of such surface light source devices, there is a demand for extracting light in a useful manner from the element with high efficiency. For example, although the light-emitting layer of the organic EL element itself has high luminous efficiency, the amount of light tends to be decreased by interference or the like in the layers during the passage of the light through the layered structure constituting the surface light source device until the light exits. Therefore, there is a demand for reducing such loss of light as much as possible.

As a technique for increasing the light extraction efficiency, there is known a technique of disposing a variety of optical functional layers on the surface on the light exit surface side of the organic EL element. Examples of such optical functional layers may include a structural layer having a surface that includes a plurality of concave portions or convex portions. As a specific example, Patent Literature 1 discloses a surface light source device in which a structural layer having a plurality of concave portions is disposed, via an adhesive layer, on the surface of a glass substrate which is arranged in a portion closest to a light exit surface of an organic EL element.

CITATION LIST

Patent Literature

Patent Literature 1: International Publication No. WO 2010/143705

SUMMARY

Technical Problem

Prior-art adhesive layers generally have low refractive indexes. Therefore, when an optical functional layer was disposed via the adhesive layer on a glass substrate as disclosed in Patent Literature 1, the refractive index of the adhesive layer was lower than that of the glass substrate. Consequently, the interface between the glass substrate and the adhesive layer tends to cause remarkable reflection of light that has been generated in the light-emitting layer of the organic EL element. This reflection was one of the factors causing the reduction of light extraction efficiency. Therefore, this reflection is required to be suppressed.

When the refractive index of the adhesive layer is made higher than that of the glass substrate in the organic EL element, the above-described reflection is suppressed. Thus, light extraction efficiency is expected to be improved. Therefore, the present inventor attempted to increase the refractive index of the adhesive layer. The adhesive layer is usually formed of a polymer. However, it is difficult to elevate the refractive index of the adhesive layer formed of only a polymer than the refractive index of the glass substrate. Therefore, the present inventor attempted to form the adhesive layer from a resin that is a mixture of a polymer and a variety of additives.

The increased refractive index of the adhesive layer improved light extraction efficiency. However, a phenomenon was observed in which adhesion of the adhesive layer decreases. Specifically, the following phenomenon was caused. Generally, an adhesive layer is manufactured as a multilayer film including a separator film layer and an adhesive layer. The manufactured multilayer film is transported to a user (for example, a manufacturer of surface light source devices), stored as necessary, and thereafter used for bonding. However, it was found out that the adhesion of the adhesive layer was reduced at a time point after the transportation and storage. When such an adhesive layer is used, the adhesive layer can be easily peeled off from the organic EL element. Therefore, it is desired to develop an adhesive layer that is capable of not only improving light extraction efficiency but also having high adhesion even after time has elapsed.

The present invention has been devised in view of the above-described problems, and the object thereof is to provide: an optical layered body that can be bonded to an organic EL element with high adhesion after time has elapsed and that can improve the light extraction efficiency of a surface light source device; and a surface light source device including the optical layered body.

Solution to Problem

The present inventor has intensively conducted research for solving the above-described problems. As a result, the present inventor has found out that when an optical layered body comprising a substrate layer, a first adhesive layer disposed on one surface of this substrate layer, and a second adhesive layer disposed on an opposite surface of the first adhesive layer to the substrate layer, wherein the second adhesive layer includes particles capable of scattering light, and a refractive index $n1$ of the first adhesive layer and a refractive index $n2$ of the second adhesive layer fall within a specific range, is used, bonding to an organic EL element with high adhesion in a surface light source device can be achieved even after time has elapsed, and furthermore, the light extraction efficiency of the surface light source device can be improved. Thus, the present invention has been completed.

That is, the present invention is as follows.

[1] An optical layered body comprising: a substrate layer; a first adhesive layer disposed on one surface of the substrate layer; and a second adhesive layer disposed on an opposite surface of the first adhesive layer to the substrate layer, wherein the second adhesive layer includes particles that are capable of scattering light, and a refractive index $n1$ of the first adhesive layer and a refractive index $n2$ of the second adhesive layer satisfy $1.40 \leq n1 \leq 1.50$, $1.47 \leq n2 \leq 1.85$, and $0 < n2 - n1 \leq 0.45$.

[2] The optical layered body according to [1], wherein a thickness d1 of the first adhesive layer and a thickness d2 of the second adhesive layer satisfy $$0.1 \leq d2/d1 \leq 1.0.$$

[3] The optical layered body according to [1] or [2], wherein the second adhesive layer includes particles that are capable of increasing a refractive index of the second adhesive layer.

[4] A surface light source device comprising: an organic electroluminescent element; the optical layered body according to any one of [1] to [3]; and an optical functional layer, wherein the surface light source device includes the organic electroluminescent element, the second adhesive layer, the first adhesive layer, the substrate layer, and the optical functional layer, in this order.

Advantageous Effects of Invention

The optical layered body according to the present invention can be bonded to the organic EL element in the surface light source device with high adhesion after time has elapsed. Furthermore, the optical layered body can improved light extraction efficiency of the surface light source device.

In the surface light source device according to the present invention, the optical layered body is firmly bonded to the organic EL element. Furthermore, the surface light source device according to the present invention has high light extraction efficiency.

DESCRIPTION OF EMBODIMENTS

The present invention will be described in detail with reference to embodiments and exemplifications. However, the present invention is not limited to the following embodiments and exemplifications, and may be implemented with any modifications without departing from the scope of the claims of the present invention and equivalents thereto.

[1. Outline of Optical Layered Body]

Figure 1:
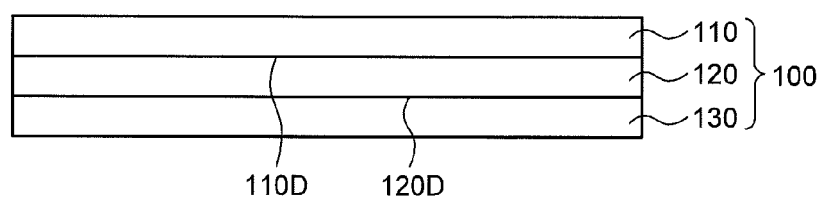
FIG. 1 is a cross-sectional view schematically illustrating an optical layered body according to an embodiment of the present invention.

FIG. 1 is a cross-sectional view schematically illustrating an optical layered body 100 according to an embodiment of the present invention. As illustrated in FIG. 1, the optical layered body 100 includes: a substrate layer 110; a first adhesive layer 120 disposed on one surface 110D of the substrate layer 110; and a second adhesive layer 130 disposed on an opposite surface 120D to the substrate layer 110 of the first adhesive layer 120. Therefore, the optical layered body 100 includes the substrate layer 110, the first adhesive layer 120, and the second adhesive layer 130, in this order.

[2. Substrate Layer]

The substrate layer is a member that supports the first adhesive layer and the second adhesive layer. As a material for this substrate layer, any material suitable for an optical member may be appropriately selected and used. Especially, a transparent resin is preferable as a material for the substrate layer, because molding can be easily performed, and desired optical performance is readily obtained. As used herein, the expression that the transparent resin is "transparent" means that the resin has a light transmittance suitable for use as an optical member. Specifically, it means that the total light transmittance of the resin at a thickness of 1 mm is preferably 80% or higher and 100% or lower, and more preferably 90% or higher and 100% or lower. The total light transmittance may be measured in accordance with JIS K7361-1997.

Examples of the transparent resin may include thermoplastic resins, thermosetting resins, UV curable resins, and electron beam curable resins. Of these, thermoplastic resins are preferable, because thermoplastic resins can be easily deformed by heat. Also, UV curable resins are preferable, because UV curable resins have high curability and easiness of formation.

The transparent resin usually include a polymer. Examples of the polymer that may be contained in thermoplastic resins may include polyester, polyacrylate, and cycloolefin polymer. Furthermore, examples of the polymer that may be contained in UV curable resins may include an epoxy polymer, an acrylic polymer, a urethane polymer, an ene/thiol polymer, and an isocyanate polymer. A particularly preferable example of the polymer is a polymer having a plurality of polymerizable functional groups per molecule. One type thereof may be solely used, and two or more types thereof may also be used in combination at any ratio.

If necessary, the transparent resin may further include an optional component. Examples of the optional component may include a component that imparts light-scattering property, such as particles; antidegradants such as a phenol compound and an amine compound; surfactants; antistatic agents such as a siloxane compound; and light resistant agents such as a triazole compound and a 2-hydroxybenzophenone compound. One type thereof may be solely used, and two or more types thereof may also be used in combination at any ratio.

As the substrate layer, a film-shaped member is usually used. The substrate layer may have a single-layered structure, and may also have a multi-layered structure including two or more layers.

From the viewpoint of achieving the favorable mechanical strength and handling property of the optical layered body, the thickness of the substrate layer is preferably 20 μm or more, more preferably 30 μm or more, and particularly preferably 50 μm or more, and is preferably 300 μm or less, more preferably 250 μm or less, and particularly preferably 200 μm or less.

[3. First Adhesive Layer]

The first adhesive layer is a layer having adhesiveness that allows bonding to an appropriate optical member with specific adhesion, and is formed of an adhesive agent. In the present application, the adhesive agent is not limited to an adhesive agent in a narrow sense but includes a so-called hot-melt adhesive agent. The adhesive agent in a narrow sense means an adhesive agent having a shear storage modulus at 23° C. of less than 1 MPa and exhibiting adhesiveness at room temperature. The so-called hot-melt adhesive agent means an adhesive agent having a shear storage modulus at 23° C. of 1 MPa to 500 MPa and exhibiting no adhesiveness at room temperature. Of these, as the adhesive agent, the adhesive agent in a narrow sense exhibiting adhesiveness at room temperature is preferably used. Such an adhesive agent in a narrow sense is a pressure sensitive adhesive agent that can express adhesiveness by the application of pressure, and thus enables simple bonding without incurring adverse effects, such as deterioration caused by heating, on the organic EL element. The adhesive agent that may be used for the first adhesive layer is appropriately referred to hereinbelow as a "first adhesive agent".

In the present invention, the first adhesive layer has a refractive index n1 of usually 1.40 or more, and preferably 1.45 or more, and of usually 1.50 or less, and preferably 1.49 or less. The adhesive agent having such low refractive index is generally soft. Therefore, combining such a first adhesive layer with the second adhesive layer can increase the adhesion of the second adhesive layer to the organic EL element. The refractive index may be measured using an ellipsometer (for example, "M-2000" manufactured by J. A. Woollam Japan Co., Inc.).

As the first adhesive agent, resin is usually used. This resin includes a polymer as an adhesive material having adhesiveness. Examples of the first adhesive agent may include acrylic adhesive agents, rubber-based adhesive agents, silicone-based adhesive agents, urethane-based adhesive agents, vinyl alkyl ether-based adhesive agents, polyvinyl alcohol-based adhesive agents, polyvinyl pyrrolidone-based adhesive agents, polyacrylamide-based adhesive agents, and cellulose-based adhesive agents. One type thereof may be solely used, and two or more types thereof may also be used in combination at any ratio.

The first adhesive layer usually has higher elasticity than that of the second adhesive layer. That is, the deformed first adhesive layer usually returns to its original shape more easily than the deformed second adhesive layer. Specifically, the tendency as described below is observed.

There are prepared: a layered body including a substrate layer, a first adhesive layer, and a separator; and a layered body including a substrate layer, a second adhesive layer, and a separator. The surfaces of the separators of these layered bodies are applied with a load of 2 N using a pencil-type scratch hardness tester ("318S" manufactured by Erichsen GmbH & Co. KG.) to deform the first adhesive layer and the second adhesive layer into a concave shape. Thereafter, the separators are peeled. Then the first adhesive layer and the second adhesive layer, which have been exposed by the peeling of the separators, are each bonded to glass. Immediately after the bonding, deformation can be observed in the concave-shaped portions of both the first adhesive layer and the second adhesive layer. However, in 24 hours after the bonding, there is a tendency that, while deformation can be still observed in the second adhesive layer, deformation is not observed in the first adhesive layer.

Such high elasticity of the first adhesive layer is considered to be one of the reasons why the second adhesive layer in the optical layered body according to the present invention has excellent adhesiveness to another member even though the second adhesive layer is hard.

The first adhesive layer has a thickness d1 of preferably 20 μm or more, more preferably 25 μm or more, and particularly preferably 30 μm or more; and of preferably 100 μm or less, more preferably 80 μm or less, and particularly preferably 60 μm or less. When the thickness of the first adhesive layer is equal to or more than the lower limit of the above-described range, adhesiveness can be enhanced. When the thickness thereof is equal to or less than the upper limit, adhesiveness can be prevented from becoming excessively high, thereby enabling appropriate adhesiveness to be retained. Furthermore, deterioration (such as change in color) of the first adhesive layer after the bonding to the organic EL element can be mitigated.

The first adhesive layer may be formed by, e.g., applying a coating liquid suitable for forming the first adhesive layer onto a surface of a desired member, and then performing an optional operation for curing the applied liquid (such as drying). As the coating liquid suitable for forming the first adhesive layer, a liquid composition containing the above-described first adhesive agent may be used.

If necessary, the coating liquid may further contain an optional component such as a solvent and an additive. Examples of the optional component may include the same component as those that may be contained in the coating liquid suitable for forming the second adhesive layer.

For example, the first adhesive layer may be formed on one surface of the substrate layer by applying the above-described coating liquid onto a surface of the substrate layer and then performing an operation for curing. Alternatively, for example, the first adhesive layer may be formed on one surface of the substrate layer by applying the above-described coating liquid onto a surface of a separator film layer, performing an optional operation for curing to form the first adhesive layer on the surface of the separator film layer, and then bonding the first adhesive layer to the substrate layer.

[4. Second Adhesive Layer]

The second adhesive layer is a layer having adhesiveness that allows bonding to an appropriate optical member with specific adhesion, and is formed of an adhesive agent. The adhesive agent that may be used for the second adhesive layer is appropriately referred to hereinbelow as a "second adhesive agent". The second adhesive agent is preferably an adhesive agent in a narrow sense exhibiting adhesiveness at room temperature. Such an adhesive agent in a narrow sense is a pressure sensitive adhesive agent that can express adhesiveness by the application of pressure, and thus enables simple bonding without incurring adverse effects, such as deterioration caused by heating, on the organic EL element.

In the present invention, the second adhesive layer has a refractive index n2 of usually 1.47 or more, preferably 1.50 or more, and more preferably 1.55 or more, and of usually 1.85 or less, preferably 1.80 or less, and more preferably 1.70 or less. The second adhesive layer having such a high refractive index n2 can have higher refractive index than a light-transmissive substrate of the organic EL element. Therefore, when the second adhesive layer and the light-transmissive substrate of the organic EL element are bonded together, light which proceeds from the light-transmissive substrate to the second adhesive layer can be suppressed from being reflected at an interface between the light-transmissive substrate and the second adhesive layer. Thus, the surface light source device including the organic EL element and the optical layered body according to the present invention can have improved light extraction efficiency.

By the way, the second adhesive layer includes particles that are capable of scattering light (appropriately referred to hereinbelow as "light-scattering particles"), and therefore generally has high light-scattering property. Therefore, in some cases, there might be a difficulty in the measurement of the refractive index of the second adhesive layer. In such cases, a layer, which is the same as the second adhesive layer to be measured except that light-scattering particles are not contained, may be prepared as a sample for measuring the refractive index, and the prepared sample may be measured for its refractive index to measure the refractive index of the second adhesive layer. Generally, a small amount of the light-scattering particles scarcely changes the refractive index of the layer containing the particles. Therefore, by using the sample not containing the light-scattering particles, the value of the refractive index which is substantially the same as that of the second adhesive layer can be measured.

The refractive index $n2$ of the second adhesive layer is usually larger than the refractive index $n1$ of the first adhesive layer. That is, the refractive index difference ($n2-n1$) is larger than 0, preferably 0.05 or more, and more preferably 0.10 or more. This can enhance the adhesion of the second adhesive layer to the organic EL element. The reason why combining the second adhesive layer having a relatively large refractive index $n2$ with the first adhesive layer having a relatively small refractive index $n1$ can enhance the adhesion of the second adhesive layer is inferred as follows. However, the present invention is not limited by the inference described below.

In general, when an adhesive layer is bonded to a light-transmissive substrate of an organic EL element, it is considered that the following two adhesion forces are working.

(i) Chemical adhesion force caused by chemical interactions (for example, chemical bonds and electrical bonds) between the compound forming the adhesive layer and the compound forming the light-transmissive substrate.

(ii) Physical adhesion force caused by sticking of the adhesive layer that is in close contact with the light-transmissive substrate as an atmospheric pressure is applied to the adhesive layer (for example, vacuum adhesion).

However, the second adhesive layer having a high refractive index $n2$ usually has high hardness. The second adhesive layer having high hardness does not easily deform in conformity with the surface shape of the light-transmissive substrate. Therefore, the contact surface area between the second adhesive layer and the light-transmissive substrate is reduced. This reduces chemical interactions between the compound forming the adhesive layer and the compound forming the light-transmissive substrate. Thus, the chemical adhesion force is reduced. Moreover, such a small contact surface area between the second adhesive layer and the light-transmissive substrate causes a large amount of fine voids that are created between the second adhesive layer and the light-transmissive substrate. This reduces the effect of the atmospheric pressure pushing the second adhesive layer toward the light-transmissive substrate. Accordingly, the physical adhesion force is also reduced. Therefore, bonding only the second adhesive layer having a high refractive index $n2$ to the light-transmissive substrate does not lead to the achievement of high adhesion.

In contrast to this, in the optical layered body including the combination of the first adhesive layer with the second adhesive layer, the first adhesive layer having a low refractive index is soft and flexible. Therefore, the first adhesive layer can easily deform. By virtue of the effect of the first adhesive layer, closeness of the contact between the light-transmissive substrate and the second adhesive layer can be enhanced when the optical layered body is bonded to the light-transmissive substrate. It is inferred that this can increase the contact surface area between the light-transmissive substrate and the second adhesive layer, thereby enhancing the chemical adhesion force and the physical adhesion force. The lower limit of the adhesion force (N/cm) of the optical layered body including the combination of the second adhesive layer with the first adhesive layer to glass is preferably 0.6 (N/cm) or more, and further preferably 1.0 (N/cm) or more, from the viewpoint of inhibiting peeling during actual use. The upper limit of the adhesion force is preferably 8.0 (N/cm) or less, in consideration of facilitating rework on glass.

The difference ($n2-n1$) between the refractive index $n2$ of the second adhesive layer and the refractive index $n1$ of the first adhesive layer is generally 0.45 or less, preferably 0.44 or less, and more preferably 0.43 or less. When the refractive index difference ($n2-n1$) falls within such a range, reflection at an interface between the first adhesive layer and the second adhesive layer can be reduced. The lower limit of the above-described refractive index difference ($n2-n1$) is preferably 0.03 or more.

As the second adhesive agent, resin is usually used. This resin includes a polymer as an adhesive material having adhesiveness. Examples of the second adhesive agent may include acrylic adhesive agents, rubber-based adhesive agents, silicone-based adhesive agents, urethane-based adhesive agents, vinyl alkyl ether-based adhesive agents, polyvinyl alcohol-based adhesive agents, polyvinyl pyrrolidone-based adhesive agents, polyacrylamide-based adhesive agents, and cellulose-based adhesive agents. Of these, acrylic adhesive agents, which are excellent in properties such as transparency, weather resistance, and heat resistance, are preferable.

The acrylic adhesive agent usually includes an acrylic polymer as an adhesive material. The acrylic polymer is a polymer that includes a structural unit having a structure formed by polymerizing an acrylic monomer. Examples of such an acrylic polymer may include: a polymer obtained by polymerizing an acrylic monomer; and a polymer obtained by polymerizing a mixture (monomer mixture) of an acrylic monomer and a monomer that can be copolymerized with the acrylic monomer.

Examples of the acrylic monomer may include alkyl (meth)acrylate. (Meth)acrylate herein includes acrylate, methacrylate, or a mixture of acrylate and methacrylate. The average of the number of carbons in an alkyl group of alkyl (meth)acrylate is preferably 1 or more, and more preferably 3 or more, and is preferably 12 or less, and more preferably 8 or less. Specific examples of alkyl (meth)acrylate may include methyl (meth)acrylate, ethyl (meth)acrylate, butyl (meth)acrylate, 2-ethylhexyl (meth)acrylate, and isooctyl (meth)acrylate. One type thereof may be solely used, and two or more types thereof may also be used in combination at any ratio.

Preferable examples of the monomer that can be copolymerized with the acrylic monomer may include a monomer having a functional group, a nitrogen atom-containing monomer, and a modifying monomer.

Examples of the monomer having a functional group may include a monomer having a carboxyl group, a monomer having a hydroxyl group, and a monomer having an epoxy group. Examples of the monomer having a carboxyl group may include acrylic acid, methacrylic acid, fumaric acid, maleic acid, and itaconic acid. Examples of the monomer having a hydroxyl group may include 2-hydroxyethyl (meth)acrylate, hydroxybutyl (meth)acrylate, hydroxyhexyl (meth)acrylate, and N-methylol (meth)acrylamide. Examples of the monomer having an epoxy group may include glycidyl (meth)acrylate. When the acrylic monomer and the monomer having a functional group are used in combination, the ratio between the two monomers preferably falls within a specific range. Specifically, it is preferable that the acrylic monomer is 60% by weight to 99.8% by weight, while the monomer having a functional group is 40% by weight to 0.2% by weight, with respect to 100% by weight of the total amount of the acrylic monomer and the monomer having a functional group.

Examples of the nitrogen atom-containing monomer may include (meth)acrylamide, N,N-dimethyl (meth)acrylamide, N,N-diethyl (meth)acrylamide, (meth)acryloyl morpholine, (meth)acetonitrile, vinylpyrrolidone, N-cyclohexyl maleimide, itaconimide, and N,N-dimethylaminoethyl (meth)acrylamide. (Meth)acrylamide herein includes acrylamide, methacrylamide, or a mixture of acrylamide and methacrylamide. Also, (meth)acryloyl morpholine includes acryloyl morpholine, methacryloyl morpholine, or a mixture of acryloyl morpholine and methacryloyl morpholine. Furthermore, (meth)acetonitrile includes acetonitrile, methacetonitrile, or a mixture of acetonitrile and methacetonitrile. When the acrylic monomer and the nitrogen atom-containing monomer are used in combination, the ratio between the two monomers preferably falls within a specific range. Specifically, it is preferable that the acrylic monomer is 60% by weight to 99.8% by weight, while the nitrogen atom-containing monomer is 40% by weight to 0.2% by weight, with respect to 100% by weight of the total amount of the acrylic monomer and the nitrogen atom-containing monomer.

Examples of the modifying monomer may include vinyl acetate and styrene. When the acrylic monomer and the modifying monomer are used in combination, the ratio between the two monomers preferably falls within a specific range. Specifically, it is preferable that the acrylic monomer is 60% by weight to 99.8% by weight, while the modifying monomer is 40% by weight to 0.2% by weight, with respect to 100% by weight of the total amount of the acrylic monomer and the modifying monomer.

As the monomers that can be copolymerized with the acrylic monomer, one type thereof may be solely used, and two or more types thereof may also be used in combination at any ratio.

The amount of the polymer that is the adhesive material in the second adhesive agent is preferably 10% by weight or more, and more preferably 20% by weight or more, and is preferably 80% by weight or less, and more preferably 70% by weight or less with respect to the total amount of the second adhesive agent.

The second adhesive agent further includes particles (light-scattering particles) that are capable of scattering light. Light which enters the second adhesive layer is then scattered by the light-scattering particles, whereby the light extraction efficiency of the surface light source device including the optical layered body can be increased.

As the light-scattering particles, an inorganic material may be used, and an organic material may also be used.

Examples of the inorganic material of the light-scattering particles may include metal and metal compounds. Examples of the metal compound may include oxides and nitrides of metal. Specific examples thereof may include metal such as silver and aluminum; and metal compounds such as silicon oxide, aluminum oxide, zirconium oxide, silicon nitride, tin-added indium oxide, and titanium oxide.

Examples of the organic material of the light-scattering particles may include resins such as a silicone resin, an acrylic resin, and a polystyrene resin.

As the material for the light-scattering particles, one type thereof may be solely used, and two or more types thereof may also be used in combination at any ratio.

Of these, the light-scattering particles formed of an organic material are preferably used. The second adhesive layer is usually manufactured using a coating liquid suitable for forming the second adhesive layer. The light-scattering particles easily settle down in this coating liquid. This settlement is likely to occur especially when the liquid contains particles that are capable of increasing the refractive index of the second adhesive layer (appropriately referred to hereinbelow as "highly refractive particles") such as those which will be described later. In contrast to this, the light-scattering particles formed of an organic material are unlikely to cause the settlement. Therefore, use of the light-scattering particles formed of an organic material can achieve the second adhesive layer in which the light-scattering particles are uniformly contained without imbalance. The second adhesive layer which uniformly contains the light-scattering particles in this manner can stably express adhesion, and is therefore preferable.

Examples of suitable light-scattering particles formed of an organic material may include: light-scattering particles formed of a silicone resin, such as trade name "XC-99" (manufactured by Momentive Performance Materials Inc., volume average particle diameter 0.7 µm); light-scattering particles formed of an acrylic resin, such as trade name "MP series" (manufactured by Soken Chemical & Engineering Co., Ltd., volume average particle diameter 0.8 µm); and light-scattering particles formed of a polystyrene resin, such as trade name "SX series" (manufactured by Soken Chemical & Engineering Co., Ltd., volume average particle diameter 3.5 µm).

The light-scattering particles have a volume average particle diameter of preferably 0.2 µm or more, and more preferably 0.5 µm or more, and of preferably 5 µm or less, and more preferably 3 µm or less. When the volume average particle diameter of the light-scattering particles is equal to or less than the upper limit of the above-described range, light in the visible range can be scattered. The volume average particle diameter is a particle diameter at which the cumulative volume calculated from the small diameter side in a particle diameter distribution measured by a laser diffraction method reaches 50%.

The ratio of the light-scattering particles in the second adhesive agent, as a ratio relative to the total amount of the second adhesive agent, is preferably 0.5% by weight or more, and more preferably 1% by weight or more, and is preferably 15% by weight or less, and more preferably 10% by weight or less. When the ratio of the light-scattering particles is equal to or more than the lower limit of the above-described range, a desired light scattering effect can be obtained thereby to suppress the color unevenness of the extracted light in the polar angle direction. When the ratio is equal to or less than the upper limit, the surface can be made uniform. Furthermore, the value of an initial adhesion force can be prevented from becoming extremely low.

The second adhesive agent preferably further includes highly refractive particles that are capable of increasing the refractive index of the second adhesive layer. The highly refractive particles for use may usually be particles that have a smaller volume average particle diameter than the light-scattering particles and that have a higher refractive index than the adhesive material contained in the second adhesive layer. Examples of such highly refractive particles may include particles formed of an inorganic material and particles formed of an organic material having a refractive index of 1.68 or more.

Examples of the inorganic material may include oxides such as zirconia, titania, tin oxide, and zinc oxide; titanates such as barium titanate and strontium titanate; and sulfides, selenides, and tellurides such as CdS, CdSe, ZnSe, CdTe, ZnS, HgS, HgSe, PdS, and SbSe. Examples of the organic material having a refractive index of 1.68 or more may include a polystyrene resin. One type thereof may be solely used, and two or more types thereof may also be used in combination at any ratio. The surfaces of these highly refractive particles may be surface-modified with a variety of functional groups for increasing dispersibility, a silane coupling agent, and the like.

Especially, modified reactive metal oxide particles are preferable as the highly refractive particles. The modified reactive metal oxide particles are particles that include metal oxide and an organic substance having a reactive functional group which modifies the surface of the metal oxide. More specifically, the modified reactive metal oxide is a coated particle that includes a metal oxide particle and an organic substance having a reactive functional group which modifies the surface of the particle.

In the modified reactive metal oxide, the reactive functional group may be in a state of having interactions, such as hydrogen bonds, with a metal oxide. The reactive functional group may not be in such a state, and may be in a state of being capable of interacting with other substances.

Examples of the reactive functional group in the organic substance having a reactive functional group may include a hydroxyl group, a phosphate group, a carboxyl group, an amino group, an alkoxy group, an isocyanate group, an acid halide, an acid anhydride, a glycidyl group, a chlorosilane group, and an alkoxysilane group. One type thereof may be solely used, and two or more types thereof may also be used in combination at any ratio.

As the organic substance having a reactive functional group, an organic substance having an isocyanate group is particularly preferable for enhancing the stability of the metal oxide and the substance around the metal oxide. Examples of the organic substance having an isocyanate group may include acryloxymethyl isocyanate, methacryloxymethyl isocyanate, acryloxyethyl isocyanate, methacryloxyethyl isocyanate, acryloxypropyl isocyanate, methacryloxypropyl isocyanate, and 1,1-bis(acryloxymethyl)ethyl isocyanate. One type thereof may be solely used, and two or more types thereof may also be used in combination at any ratio.

Examples of the metal oxide constituting the modified reactive metal oxide may include titanium oxide, zinc oxide, zirconium oxide, antimony oxide, tin-doped indium oxide (ITO), antimony-doped tin oxide (ATO), fluorine-doped tin oxide (FTO), phosphorus-doped tin oxide (PTO), zinc antimonate (AZO), indium-doped zinc oxide (IZO), aluminum-doped zinc oxide, gallium-doped zinc oxide, cerium oxide, aluminum oxide, and tin oxide. One type thereof may be solely used, and two or more types thereof may also be used in combination at any ratio.

In the modified reactive metal oxide particles, the ratio of the organic substance having a reactive functional group relative to 100 parts by weight of the metal oxide may be 1 part by weight to 40 parts by weight.

The modified reactive metal oxide particles may be obtained as, e.g., a suspension in which the particles are dispersed in the organic solvent by mixing the metal oxide particles, the organic substance having a reactive functional group, an organic solvent, and as necessary, an optional additive, and then subjecting the resulting mixture to an optional treatment such as an ultrasonic treatment.

Examples of the organic solvent may include ketones such as methyl ethyl ketone, methyl isobutyl ketone, acetone, and cyclohexanone; aromatic hydrocarbons such as benzene, toluene, xylene, and ethylbenzene; alcohols such as methanol, ethanol, isopropyl alcohol, n-butanol, and iso-butanol; ethers such as ethylene glycol monomethyl ether, ethylene glycol monoethyl ether, ethylene glycol monobutyl ether, diethylene glycol monomethyl ether, and diethylene glycol monoethyl ether; esters such as ethyl acetate, butyl acetate, ethyl lactate, γ-butyrolactone, propylene glycol monomethyl ether acetate, and propylene glycol monoethyl ether acetate; and amides such as dimethylformamide, N,N-dimethylacetoacetamide, and N-methylpyrrolidone. As the organic solvent, one type thereof may be solely used, and two or more types thereof may also be used in combination at any ratio.

Examples of the optional additive may include a metal chelating agent. As the additive, one type thereof may be solely used, and two or more types thereof may also be used in combination at any ratio.

When the modified reactive metal oxide particles are obtained as a suspension in which the particles are dispersed in the organic solvent, it is preferable to adjust the conditions such as the amount of the solvent such that the suspension contains the modified reactive metal oxide particles in an amount of 1% by weight to 50% by weight. The suspension obtained as described above is preferably used as it is for the manufacture of the adhesive agent. Accordingly, the simplicity of manufacture can be improved.

When mixing, a mixer such as a bead mill is preferably used. By such mixing, secondary or higher-order particles can be pulverized into the level of primary particles, thereby allowing a surface treatment in the state of primary particles. This enables uniform surface treatment.

It is preferable that the mixture is further subjected to an optional ultrasonic treatment. The ultrasonic treatment may be performed using an apparatus such as an ultrasonic washer, an ultrasonic homogenizer, and an ultrasonic disperser. Such a treatment enables production of a favorable suspension.

As the modified reactive metal oxide particles, commercially available particles may be used. Examples of a slurry of the modified reactive metal oxide particles including $ZrO_2$ as the metal oxide may include trade name "ZR-010" (manufactured by Solar Co., Ltd., solvent: methyl ethyl ketone, particle content ratio: 30%, the organic substance having a reactive functional group which modifies the surface: isocyanate having a polymerizable functional group, volume average particle diameter: 15 nm). Examples of the slurry of the modified reactive metal oxide particles including $TiO_2$ as the metal oxide may include trade name "NOD-742GTF" (manufactured by Nagase ChemteX Corporation, solvent: polyethylene glycol monomethyl ether, particle content ratio: 30%, volume average particle diameter: 48 nm).

As the highly refractive particles, one type thereof may be solely used, and two or more types thereof may also be used in combination at any ratio The highly refractive particles have a volume average particle diameter of preferably 1 nm or more, more preferably 3 nm or more, and particularly preferably 5 nm or more, and of preferably 500 nm or less, more preferably 200 nm or less, further preferably 100 nm or less, and particularly preferably 50 nm or less. When the volume average particle diameter of the highly refractive particles is equal to or less than the upper limit of the above-described range, the second adhesive layer being less colored and having high light transmittance can be obtained. Furthermore, the highly refractive particles having such a size are easily dispersed. When the highly refractive particles aggregate to form secondary or higher-order particles, the above-described range of the volume average particle diameter may be the range of the primary particle diameter.

The ratio of the highly refractive particles in the second adhesive agent, as a ratio relative to the total amount of the second adhesive agent, is preferably 20% by weight or more, more preferably 30% by weight or more, and particularly preferably 40% by weight or more, and is preferably 80% by weight or less, and more preferably 70% by weight or less. When the ratio of the highly refractive particles is equal to or more than the lower limit of the above-described range, the refractive index of the second adhesive layer can be increased. When the ratio thereof is equal to or less than the upper limit, the hardness of the second adhesive layer can be inhibited from increasing, and the adhesion can be inhibited from decreasing. Use of the above-described fine particles as the highly refractive particles extraordinarily increases the total particle surface area. Because the particles interact with the polymer molecular chain or monomer molecule of the adhesive agent, the particles also influence the adhesion. Therefore, the amount thereof is preferably set to the above-described value.

The second adhesive agent may further include a plasticizer. Use of the plasticizer can decrease viscosity of the second adhesive agent, and can increase adhesiveness of the second adhesive layer. Particularly, when the second adhesive layer contains the highly refractive particles, viscosity of the second adhesive agent tends to increase and adhesiveness of the second adhesive layer tends to decrease. Thus it is preferable to use a plasticizer. According to the studies conducted by the present inventor, it is considered that a plasticizer may reduce the adhesiveness of the second adhesive layer over time. However, the combination of the first adhesive layer with the second adhesive layer enables the second adhesive layer of the optical layered body according to the present invention to have high adhesiveness even after time has elapsed. Therefore, the optical layered body according to the present invention is technologically significant in terms of achieving both that the second adhesive agent includes a plasticizer and that the second adhesive layer can have high adhesiveness even after time has elapsed.

Examples of the plasticizer may include polybutene, vinyl ether compounds, polyether compounds (including polyalkylene oxide and functionalized polyalkylene oxide), ester compounds, polyol compounds (for example, glycerin), petroleum resins, hydrogenated petroleum resins, and styrene-based compounds (for example, α-methylstyrene). Of these, ester compounds are preferable because of their good miscibility with the adhesive material and a relatively high refractive index. Especially, an ester compound containing an aromatic ring, such as a benzoic acid-based ester compound and a phthalic acid-based ester compound, are preferable.

Examples of benzoic acid esters that may be used as the plasticizer may include diethylene glycol dibenzoate, dipropylene glycol dibenzoate, benzyl benzoate, and 1,4-cyclohexanedimethanol dibenzoate. Particularly preferable examples thereof may include benzoic acid-based ester compounds such as dipropylene glycol dibenzoate and benzyl benzoate; and phthalic acid-based ester compounds such as dimethyl phthalate, diethyl phthalate, dibutyl phthalate, butyl benzyl phthalate, dicyclohexyl phthalate, and ethyl phthalyl ethyl glycolate. Furthermore, examples of a commercially available plasticizer may include trade name "BENZOFLEX 9-88SG" (manufactured by Eastman Chemical Company).

As the plasticizer, one type thereof may be solely used, and two or more types thereof may also be used in combination at any ratio.

The ratio of the plasticizer relative to 100 parts by weight of the adhesive material in the second adhesive agent is preferably 1 part by weight or more, and more preferably 5 parts by weight or more, and is preferably 35 parts by weight or less, and more preferably 30 parts by weight or less.

The second adhesive layer includes the light-scattering particles thereby to have high light-scattering properties. The second adhesive layer has a haze of preferably 30% or more, and more preferably 50% or more. Such high light-scattering properties can effectively increase the light extraction efficiency of the surface light source device including the optical layered body. The upper limit of the haze of the second adhesive layer is usually 99% or less. The haze may be measured in accordance with JIS K7136-1997.

The thickness d2 of the second adhesive layer is preferably set such that a ratio d2/d1 between a thickness d1 of the first adhesive layer and the thickness d2 of the second adhesive layer falls within a desired range. Specifically, the ratio d2/d1 is preferably 0.1 or more, more preferably 0.105 or more, and particularly preferably 0.110 or more, and is preferably 1.0 or less, more preferably 0.9 or less, and particularly preferably 0.8 or less. When the ratio d2/d1 in thickness is equal to or more than the lower limit of the above-described range, light from the organic EL element can be effectively extracted and dispersed in the second adhesive layer, thereby further increasing the light extraction efficiency. When the ratio is equal to or less than the upper limit, the effect by the first adhesive layer of improving the adhesiveness of the second adhesive layer can be enhanced, thereby effectively enhancing the adhesiveness of the second adhesive layer.

The thickness d2 of the second adhesive layer is preferably set such that a total thickness (d1+d2) of the thickness d1 of the first adhesive layer and the thickness d2 of the second adhesive layer falls within a desired range. Specifically, the total thickness (d1+d2) is preferably less than 100 μm, and more preferably 80 μm or less. When the total thickness (d1+d2) falls within the above-described range, a film of the optical layered body can be thinned. In the surface light source device including the optical layered body, color unevenness can be prevented. Furthermore, adhesive residue can be prevented during the manufacture of the optical layered body. The adhesive residue refers to a phenomenon where an excess coating liquid of the coating liquid used for the manufacture of the first adhesive layer or the second adhesive layer runs over on the side of the first adhesive layer or the second adhesive layer. The lower limit of the total thickness (d1+d2) is preferably 5 μm or more.

The second adhesive layer may be formed by, e.g., applying a coating liquid suitable for forming the second adhesive layer onto a surface of a desired member, and then performing an optional operation for curing the applied liquid (such as drying). As the coating liquid suitable for forming the second adhesive layer, a liquid composition containing the above-described second adhesive agent may be used.

If necessary, the coating liquid may contain an optional component. Examples of the optional component may include additives such as a silane coupling agent and a curing agent; and a solvent.

Examples of the silane coupling agent may include vinyltrimethoxysilane, vinyltriethoxysilane, 2-(3,4-epoxycyclohexyl)ethyltrimethoxysilane, 3-glycidoxypropylmethyldimethoxysilane, 3-glycidoxypropyltrimethoxysilane, 3-glycidoxypropylmethyldiethoxysilane, 3-glycidoxypropyltriethoxysilane, p-styryltrimethoxysilane, 3-methacryloxypropylmethyldimethoxysilane, 3-methacryloxypropyltrimethoxysilane, 3-methacryloxypropylmethyldiethoxysilane, 3-methacryloxypropyltriethoxysilane, 3-acryloxypropyltrimethoxysilane, N-2-(aminoethyl)-3-aminopropylmethyldimethoxysilane, N-2-(aminoethyl)-3-aminopropyltrimethoxysilane, N-2-(aminoethyl)-3-aminopropyltriethoxysilane, 3-aminopropyltrimethoxysilane, 3-aminopropyltriethoxysilane, 3-triethoxysilyl-N-(1,3-dimethyl-butylidene)propylamine, N-phenyl-3-aminopropyltrimethoxysilane, 3-ureidopropyltriethoxysilane, 3-mercaptopropylmethyldimethoxysilane, 3-mercaptopropyltrimethoxysilane, bis(triethoxysilylpropyl)tetrasulfide, and 3-isocyanatepropyltriethoxysilane. Examples of a commercially available silane coupling agent may include trade name "KBM-803" (manufactured by Shin-Etsu Chemical Co., Ltd.). As the silane coupling agent, one type thereof may be solely used, and two or more types thereof may also be used in combination at any ratio.

The ratio of the silane coupling agent in the coating liquid, relative to 100 parts by weight of the adhesive material, is preferably 0.05 parts by weight or more, and more preferably 0.2 parts by weight or more, and is preferably 5 parts by weight or less, and more preferably 3 parts by weight or less.

Examples of the curing agent may include an isocyanate compound. Specific examples of the curing agent may include an addition polymer of isocyanate including isophorone diisocyanate (for example, trade name "NY-260A", manufactured by Mitsubishi Chemical Corporation). As the curing agent, one type thereof may be solely used, and two or more types thereof may also be used in combination at any ratio.

The ratio of the curing agent in the coating liquid, relative to 100 parts by weight of the adhesive material, is preferably 0.01 parts by weight or more, and more preferably 0.05 parts by weight or more, and is preferably 5 parts by weight or less, and more preferably 1 part by weight or less.

Examples of the solvent may include the same solvents as those that have been exemplified as the examples of the organic solvent used for the manufacture of the modified reactive metal oxide particles. As the solvent, one type thereof may be solely used, and two or more types thereof may also be used in combination at any ratio.

When a component contained in the coating liquid is manufactured by a manufacturing method using a solvent, the component may be obtained as a solution or a suspension in which the component is dissolved or dispersed in the solvent. Furthermore, when a commercially available product is purchased as a component to be contained in the coating liquid, the component may also be obtained as a solution or a suspension. In such cases, the solvent contained in the above-described solution or suspension may also be added to be used as a part or all of the solvent in the coating liquid.

The ratio of the solvent in the coating liquid, relative to 100 parts by weight of a total solid content of the coating liquid, is preferably 50 parts by weight or more, and more preferably 100 parts by weight or more, and is preferably 300 parts by weight or less, and more preferably 250 parts by weight or less. The solid content of the coating liquid refers to a substance which remains after the drying of the coating liquid.

For example, the above-described coating liquid may be applied onto the surface of an arbitrary member such as a separator film layer, and an operation for curing may be performed as necessary to form a second adhesive layer on the surface of the member. Then, the second adhesive layer may be bonded to the first adhesive layer, thereby to form the second adhesive layer on the surface of the first adhesive layer.

Although the second adhesive layer obtained in this manner may contain the component that has been contained in the coating liquid, a part of the component may be changed by reaction, and a part of the component may disappear by vaporization. For example, a drying step may cause reactive components such as the silane coupling agent and the curing agent to be changed to other substances by a reaction, and may also cause disappearance of the solvent by vaporization.

[5. Optional Layer]

It is preferable that the substrate layer and the first adhesive layer are in direct contact with each other without another layer interposed therebetween. The first adhesive layer and the second adhesive layer are preferably in direct contact with each other without another layer interposed therebetween. On the other hand, the optical layered body may include an optional layer on the opposite surface of the substrate layer to the first adhesive layer, and may also include an optional layer on the opposite surface of the second adhesive layer to the first adhesive layer. Examples of the optional layer may include a separator film layer.

The separator film layer is a film layer that covers the second adhesive layer so that the second adhesive layer is not exposed to the outside. This separator film layer can protect the second adhesive layer from scratches. This separator film layer is a layer that is generally peeled off when the optical layered body is bonded to another member such as an organic EL element and an optical film.

Examples of the material for forming the separator film layer may include the same transparent resins as those for the substrate layer. Especially, thermoplastic resins, which have excellent productivity, are preferably used.

[6. Surface Light Source Device]

In a surface light source device including an organic EL element and an optical functional layer, the optical layered body according to the present invention is used for bonding the organic EL element and the optical functional layer. Such a surface light source device will be described hereinbelow with reference to embodiments.

In the following embodiments, unless otherwise specified, a constituent component being "parallel" or "perpendicular" may include errors within the range of not impairing the effects of the present invention, for example, within the range of ±5°. Unless otherwise specified, "along" a certain direction means "in parallel to" the certain direction. Furthermore, unless otherwise specified, the thickness direction of each layer constituting the surface light source device is consistent with the thickness direction of the surface light source device, and a simple expression of a "thickness direction" indicates the thickness direction of the surface light source device. In the following embodiments, unless otherwise specified, the surface light source device will be described as placed with the light exit surface being in parallel to the horizontal direction and facing upward.

Figure 2:
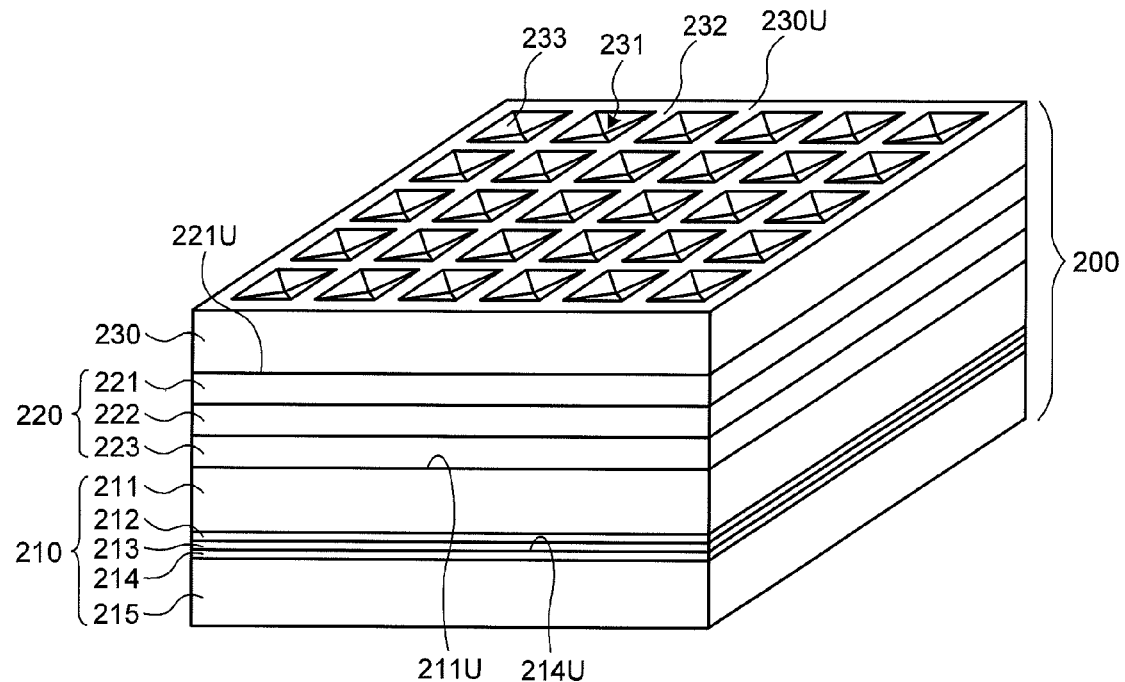
FIG. 2 is a perspective view schematically illustrating a surface light source device according to an embodiment of the present invention.

FIG. 2 is a perspective view schematically illustrating a surface light source device according to an embodiment of the present invention. In FIG. 2, a light exit surface 230U of a surface light source device 200 is a light exit surface for the entire surface light source device. That is, light generated inside the device exits from the light exit surface 230U to the outside of the device.

The surface light source device 200 includes an organic EL element 210, an optical layered body 220, and an optical functional layer 230, in this order. The optical layered body 220 includes a substrate layer 221, a first adhesive layer 222, and a second adhesive layer 223 in this order from the light exit surface 230U. Therefore, this surface light source device 200 includes the organic EL element 210, the second adhesive layer 223, the first adhesive layer 222, the substrate layer 221, and the optical functional layer 230, in this order. In this embodiment, the optical functional layer 230 is disposed closest to the uppermost surface (that is, the light exit surface), and the top surface of the optical functional layer 230 constitutes the light exit surface 230U.

The organic EL element 210 usually includes two or more electrode layers, and a light-emitting layer that is disposed between these electrodes and emits light when a voltage is applied thereto from the electrode layers. Such an organic EL element 210 may be formed by sequentially forming layers such as the electrode layers and the light-emitting layer on a light-transmissive substrate by a known method such as sputtering. Furthermore, in a general configuration, a sealing member for covering those layers is disposed so that the light-transmissive substrate and the sealing member seal the layers such as the light-emitting layer. In the present embodiment, the organic EL element 210, which includes a light-transmissive substrate 211, a first electrode layer 212, a light-emitting layer 213, a second electrode layer 214, and a sealing substrate 215 in this order, is described as an example.

The light-transmissive substrate 211 is a layer that supports the first electrode layer 212, the light-emitting layer 213, and the second electrode layer 214. The substrate for use as the light-transmissive substrate 211 is preferably a substrate that has excellent sealing property, and that can facilitate sequential formation of the layers constituting the organic EL element in a manufacturing process. By using such a substrate, the durability of the surface light source device 200 can be improved, and the manufacturing process of the surface light source device 200 can be facilitated.

As a material constituting the light-transmissive substrate 211, a material having light-transmissive property may be appropriately selected. Examples of such a material may include glass and resin. As the material for the light-transmissive substrate 211, one type thereof may be solely used, and two or more types thereof may also be used in combination at any ratio.

The refractive index of the material constituting the light-transmissive substrate 211 is usually, but not limited to, approximately 1.5. The thickness of the light-transmissive substrate 211 is preferably 0.02 mm to 5 mm.

As used herein, the expression that the light-transmissive substrate 211 is "light-transmissive" means having a light transmittance to a degree suitable for use as the material for the surface light source device 200. The layers designed to allow light to pass therethrough, among the layers constituting the surface light source device 200, may have a light transmittance suitable for use as an optical member. For example, the entire device from the light-transmissive substrate 211 to the optical functional layer 230 in a thickness direction may have a total light transmittance of 50% or more.

A light-emitting material for the light-emitting layer 213 is not particularly limited, and a material known in the art may be appropriately selected. The light-emitting material in the light-emitting layer 213 is not limited to one type, and may be two or more types in combination at any ratio. The light-emitting layer 213 may also be a layer having a single-layered structure consisting of only one layer. Furthermore, in order to adapt to the application as a light source, the light-emitting layer 213 may be a layer having a multi-layered structure including a plurality of layers in combination. Accordingly, the light-emitting layer 213 can emit white light or light having a color closer to white.

At least one of the first electrode layer 212 and the second electrode layer 214 is a transparent electrode layer formed of a light-transmissive material. As the material for the transparent electrode layer, one type thereof may be solely used, and two or more types thereof may also be used in combination at any ratio. Furthermore, the transparent electrode layer may be a layer having a single-layered structure including only one layer, and may also be a layer having a multi-layered structure including two or more layers. In the embodiment illustrated in FIG. 2, the first electrode layer 212 is a transparent electrode layer, and the second electrode layer 214 is a reflective electrode layer.

In addition to the light-emitting layer 213, the organic EL element 210 may further include an optional layer (not shown) between the first electrode layer 212 and the second electrode layer 214. Examples thereof may include a hole injection layer, a hole transport layer, an electron transport layer, and an electron injection layer. The organic EL element 210 may further include an optional constituent component such as a wiring for applying electricity to the first electrode layer 212 and the second electrode layer 214, and a peripheral structure for sealing the light-emitting layer 213.

Materials for constituting the electrode layers and the layer interposed between the electrode layers are not particularly limited. Specific examples of such materials may include the following.

Examples of the material for the electrode layer may include layers of ITO (indium tin oxide), aluminum, silver, and the like.

Examples of the material for the hole injection layer may include a starburst type aromatic diamine compound.

Examples of the material for the hole transport layer may include a triphenyl diamine derivative.

Examples of the host material for a yellow light-emitting layer may include a triphenyl diamine derivative, and examples of the dopant material for a yellow light-emitting layer may include a tetracene derivative.

Examples of the material for a green light-emitting layer may include a pyrazoline derivative.

Examples of the host material for a blue light-emitting layer may include an anthracene derivative, and examples of the dopant material for a blue light-emitting layer may include a perylene derivative.

Examples of the material for a red light-emitting layer may include a europium complex.

Examples of the material for the electron transport layer may include an aluminum quinoline complex (Alq).

The aforementioned light-emitting layers and the optional layers may be combined to obtain the light-emitting layer 213 as an light-emitting layer of so-called multi-layered type or tandem type that emits light of complementary colors. Examples of the combination of complementary colors may include yellow/blue and green/blue/red.

On a surface 211U on a side closer to the light exit surface 230U of the organic EL element 210, the optical layered body 220 is disposed. The optical layered body 220 includes the substrate layer 221, the first adhesive layer 222, and the second adhesive layer 223, which are the same as the substrate layer 110, the first adhesive layer 120, and the second adhesive layer 130 of the optical layered body 100 illustrated in FIG. 1.

The second adhesive layer 223 of the optical layered body 220 is bonded to the organic EL element 210. In the present embodiment, as illustrated in FIG. 2, the light-transmissive substrate 211 is the layer closest to the light exit surface 230U in the organic EL element 210, and therefore the second adhesive layer 223 is bonded to the surface 211U that is the top surface of the light-transmissive substrate 211.

The second adhesive layer 223 has a refractive index that is larger than the refractive index of the light-transmissive substrate 211. Furthermore, the second adhesive layer 223 contains light-scattering particles and has light-scattering property.

As the optical functional layer 230, there may be used any layer that may exert a desired optical function. Especially, from the viewpoint of increasing the extraction efficiency of the light generated in the light-emitting layer 213, a light-exit-surface-structural layer having a concavo-convex structure on the light exit surface 230U is preferably used as the optical functional layer 230, as illustrated in FIG. 2. Such an optical functional layer 230 may be a layer having a single-layered structure consisting only of one layer, and may also be a layer having a multi-layered structure including a plurality of layers. In the present embodiment, a light-exit-surface-structural layer including a concavo-convex structural layer having a single-layered structure disposed on the surface of the substrate layer 221 will be described as an example of the optical functional layer 230. In this example, since the concavo-convex structural layer itself is the optical functional layer 230, the concavo-convex structural layer is indicated by the same reference numeral "230" as that of the optical functional layer 230.

The concavo-convex structural layer 230 has a concavo-convex structure which includes, on its top surface (that is, a light exit surface) 230U, a plurality of concave portions 231 and flat portions 232 positioned around the concave portions 231. The concavo-convex structure defines the light exit surface 230U of the surface light source device 200. When viewed macroscopically by ignoring the concave portions 231, the light exit surface 230U is a plane parallel to the flat portions 232 and other layers in the surface light source device. However, when viewed microscopically, the light exit surface 230U is a concave-convex surface including inclined surfaces 233 defined by the concave portions 231. Since the drawing in the present application is schematically illustrated, only a small number of concave portions 231 are illustrated in the light exit surface 230U. However, in an actual device, the surface 230U of a single optical functional layer 230 may include a far larger number of concave portions 231.

Examples of a material for the concavo-convex structural layer 230 may include a variety of resins. Examples of such resins may include thermoplastic resins, thermosetting resins, and energy ray curable resins such as UV curable resins and electron beam curable resins. Of these, thermoplastic resins are preferable, because thermoplastic resins can be easily deformed by heat. Also, UV curable resins are preferable, because UV curable resins have high curability and high efficiency, thereby enabling efficient formation of the concavo-convex structural layer 230. Examples of the thermoplastic resins may include polyester resins, polyacrylate resins, and cycloolefin resins. Examples of the UV curable resins may include epoxy resins, acrylic resins, urethane resins, ene/thiol resins, and isocyanate resins. These resins preferably include a polymer having a plurality of polymerizable functional groups per molecule.

As the material for the concavo-convex structural layer 230, a material having high hardness after curing is preferable, because therewith the concavo-convex structure can be easily formed and scratch resistance of the concavo-convex structure can be easily obtained. Specifically, it is preferable to use a material that forms a layer having a pencil hardness of HB or higher when the layer having a thickness of 7 µm with no concave-convex structure is formed. A material that forms the layer having a pencil hardness of H or more is more preferable, and a material that forms the layer having a pencil hardness of 2H or more is still more preferable. The upper limit of the pencil hardness is usually 7H or less.

The concavo-convex structural layer 230 may have light-scattering property originated from its material itself, in addition to light-scattering property originated from the concavo-convex structure. Such a concavo-convex structural layer 230 may be formed from a resin having light-scattering property as the material. The resin having light-scattering property may be specifically a composition including a variety of types of polymers and a scatterer.

Examples of the scatterer that may be contained in the concavo-convex structural layer 230 may include a variety of particles. The particles may be transparent, or non-transparent. Examples of material of such particles may be the same as those of the light-scattering particles contained in the second adhesive layer 223.

Examples of the shape of the particles may include a spherical shape, a cylindrical shape, a cubic shape, a rectangular cuboid shape, a pyramidal shape, a conical shape, and star shape.

The particles have a volume average particle diameter of preferably 0.1 µm or more, and preferably 10 µm or less, more preferably 5 µm or less. The larger the volume average particle diameter is, the more the amount of particles necessary for obtaining a desired effect is. The smaller the volume average particle diameter is, the less the amount necessary for obtaining a desired effect is. Therefore, the smaller the volume average particle diameter the particles have, the less the amount of the particles required for obtaining a desired effect is. Such an effect includes, for example, the reduction in change of color tone depending on observation angles, and the improvement of light extraction efficiency. The specific ratio of the scatterer in the concavo-convex structural layer 230 may be 3% by weight to 50% by weight.

The thickness of the concavo-convex structural layer 230 may be preferably 1 µm or more, and more preferably 5 µm or more, and may be 10 µm or more. The thickness of the concavo-convex structural layer 230 is preferably 50 µm or less, and more preferably 25 µm or less, and may be 15 µm or less. Especially, when the thickness is equal to or less than the upper limit of the above-described range, deformation such as curling of the concavo-convex structural layer 230 caused by curing contraction can be prevented, thereby achieving the concavo-convex structural layer 230 having a favorable shape.

As illustrated in FIG. 2, preferable examples of a specific structure of the light exit surface 230U defined by the concavo-convex structural layer 230 may include a structure including the concave portions 231 that are quadrangular pyramid-type recesses and the flat portions 232 positioned around the concave portions 231.

The ratio of the area occupied by the flat portions 232 relative to a total of the area occupied by the flat portions 232 and the area occupied by the concave portions 231, when the light exit surface 230U is observed in a direction perpendicular to the light exit surface 230U, is appropriately referred to hereinbelow as a "flat portion ratio". Adjustment of this flat portion ratio can further improve the light extraction efficiency of the surface light source device 200. Specifically, when the flat portion ratio is 10% to 75%, favorable light extraction efficiency can be obtained, and the light exit surface 230U can have increased mechanical strength.

The concave portions 231 may have, in addition to the above-described pyramid shape, a cone shape, a shape of portion of a sphere, a groove shape, and combinations of these shapes. The shape of the pyramid may be a quadrangular pyramid that has a square bottom surface as exemplified by the concave portions 231. However, the shape of the pyramid is not limited to the quadrangular pyramid, and may be a triangular pyramid, a pentagonal pyramid, a hexagonal pyramid, and a quadrangular pyramid having a bottom that is not a square. Furthermore, the cone and the pyramid as described herein include not only a cone and a pyramid of ordinary shape having a pointed top, but also a cone and a pyramid having a rounded top or having a flat, chamfered top (such as a frustum shape).

The angle formed between the inclined surfaces 233 of the concave portions 231 and the light exit surface 230U is preferably 40° or more, and more preferably 45° or more, and is preferably 70° or less, and more preferably 60° or less.

In the light exit surface 230U, the plurality of concave portions 231 may be arranged in any manner. For example, the plurality of concave portions 231 may be arranged along two or more directions on the surface. More specifically, as illustrated in FIG. 2, the concave portions 231 may be arranged along two directions orthogonal to each other on the light exit surface. When the concave portions 231 are arranged in two or more directions, gap may be disposed between adjacent concave portions in one or more directions, so that such gaps constitute the flat portions 232. By adopting such a structure, both the favorable light extraction efficiency and the mechanical strength of the light exit surface 230U can be achieved.

The maximum value (Ra(max)) of the center line average roughness of the light exit surface 230U measured along a variety of directions (a variety of directions within the plane parallel to the light exit surface 230U) preferably falls within the range of 1 μm to 50 μm.

The thickness of the concavo-convex structural layer 230 is preferably determined relatively to the depth of the concave portions 231. For example, when a hard material that is advantageous for the maintenance of the durability of the concavo-convex structural layer 230 is used as a material for the concavo-convex structural layer 230, the concavo-convex structural layer 230 is preferably thin, because the flexibility of the optical functional layer 230 can be enhanced to facilitate the handling of the optical functional layer 230 during the manufacturing process of the surface light source device 200.

The manufacturing method of the optical functional layer 230 as described above is not limited. For example, the concavo-convex structural layer 230 may be disposed on a surface 221U of the substrate layer 221 of the optical layered body 220 by a photopolymer method (2P method) using the above-described material for the concavo-convex structural layer 230.

Since the surface light source device 200 according to the present embodiment is structured as described above, light generated in the light-emitting layer 213 passes, directly or after having been reflected on the second electrode layer 214 as a reflective electrode layer, through the first electrode layer 212, the light-transmissive substrate 211, the second adhesive layer 223, the first adhesive layer 222, the substrate layer 221, and the concavo-convex structural layer 230, and then exits.

As described above, the refractive index d2 of the second adhesive layer 223 is larger than the refractive index of the light-transmissive substrate 211. Therefore, the light generated in the light-emitting layer 213 can be suppressed from being reflected at the surface 211U that is an interface between the light-transmissive substrate 211 and the second adhesive layer 223. Thus, the light extraction efficiency of this surface light source device 200 can be enhanced.

The light extraction efficiency of the surface light source device 200 can be improved also by containing the light-scattering particles in the second adhesive layer 223. Specifically, among the light scattered by the light-scattering particles, the light entering the layer interfaces closer to the light exit surface 230U than the second adhesive layer 223 at a small incident angle passes through those layer interfaces, and exits through the light exit surface 230U. On the other hand, among the light scattered by the light-scattering particles, the light entering the layer interfaces closer to the light exit surface 230U than the second adhesive layer 223 at a large incident angle may be reflected at those layer interfaces. Such light can be reflected at an interface (the surface 211U) between the light-transmissive substrate 211 and the second adhesive layer 223, or on a surface 214U of the second electrode layer 214 that is a reflective electrode layer, and scattered again by the light-scattering particles in the second adhesive layer. Thereafter, the scattered light can exit through the light exit surface 230U. Therefore, the light-scattering particles contained in the second adhesive layer 223 can enhance the light extraction efficiency.

Furthermore, the inclusion of the light-scattering particles in the second adhesive layer 223 can reduce color unevenness in the surface light source device 200. As described herein, the color unevenness refers to a phenomenon where the observed color of light varies depending on the directions in which the light exit surface 230U is observed.

Furthermore, in the present embodiment, the inclusion of the concavo-convex structural layer 230 as the optical functional layer can also improve the light extraction efficiency. That is, even when light is reflected on the flat portions 232 due to a large incident angle to the flat surface 232 of the light exit surface 230U, the light can exit through the inclined surfaces 233 of the concave portions 231. Therefore, the light extraction efficiency can be improved.

Unlike the instance wherein a single-layered adhesive layer having a high refractive index is used, in the present embodiment, the refractive index of the second adhesive layer 223 can be increased, and the adhesiveness of the second adhesive layer 223 can be enhanced. Therefore, use of the optical layered body 220 according to the present embodiment enables the organic EL element 210 and the optical layered body 220 to be bonded together with high adhesion.

Although an embodiment of the present invention has been described in detail with reference to the drawings, the present invention may be implemented with further modification.

For example, the surface light source device may include an optional constituent component, in addition to the organic EL element 210, the optical layered body 220, and the optical functional layer 230.

For example, even when the reflective electrode layer according to the above-described embodiment is replaced by a layered body including a combination of a transparent electrode layer and a reflective layer, a device having the same effect as the reflective electrode layer can be structured.

For example, the reflective electrode layer according to the above-described embodiment may be replaced by a transparent electrode layer, and additionally, the same material as that of the light-transmissive substrate may be used as a sealing substrate. By employing such a structure, it is possible to configure a see-through type surface light source device from both surfaces of which light can exit, and through which an observer can view the other side.

The above-described surface light source device may be used for applications such as lighting apparatuses and backlight devices. The lighting apparatus may include the surface light source device as a light source, and may further include an optional constituent component such as a member for holding the light source and a circuit for supplying electric power. The backlight device may include the surface light source device as a light source, and may further include an optional constituent component such as an enclosure, a circuit for supplying electric power, a diffusion plate for further improving the uniformity of the exiting light, a diffusion sheet, and a prism sheet. The backlight device may be applied to and used as a backlight of a display device that controls pixels to display an image, such as a liquid crystal display device, and as a backlight of a display device that displays a fixed image such as a signboard.

EXAMPLES

The present invention will be specifically described hereinbelow with reference to Examples. However, the present invention is not limited to the following Examples. The present invention may be implemented with any modifications without departing from the scopes of claims and equivalents thereto.

In the following description, unless otherwise specified, "parts" and "%", both indicating quantity, are based on weight.

Example 1

(1-1. Manufacture of First Adhesive Layer)

A coating liquid of an acrylic adhesive agent was applied onto a sheet-shaped polyethylene terephthalate film substrate ("U34" manufactured by Toray Industries, Inc., thickness 100 μm) and heated in an oven to form a first adhesive layer (refractive index 1.48) having a thickness of 42 μm. Accordingly, a multilayer film A including the film substrate and the first adhesive layer was obtained.

(1-2. Manufacture of Second Adhesive Layer)

Into a plastic container, 188 parts by weight based on a solid content of a slurry ("ZR-010" manufactured by Solar Co., Ltd.) containing highly refractive particles, 3.3 parts by weight of silicone particles ("XC-99" manufactured by Momentive Performance Materials Inc.) which is capable of scattering light, and 564 parts by weight of a zirconia ball for dispersing (manufactured by Nikkato Corporation, trade name: "YTZ-0.5") were charged. Then, the plastic container was placed on a ball mill rack, and dispersion by the ball mill was performed at a speed of two rotations per second for 30 minutes. The highly refractive particles were coated particles which contain zirconia oxide particles and an organic substance modifying the surface of the zirconia oxide particles. As the organic substance, isocyanate having a polymerizable functional group was used. The volume average particle diameter of the highly refractive particles was 15 nm. The solvent of the slurry containing the highly refractive particle was methyl ethyl ketone, and the particle content ratio in the solid content was 30%.

After the dispersion, the zirconia ball was removed by sieving, to obtain a mixture 1.

The obtained mixture 1 was poured in a glass bottle, and left to stand for two hours. After that, 100 parts by weight of an acrylic adhesive agent ("X-3110335" manufactured by Saiden Chemical Industry Co., Ltd., solid content: 35%), and 5 parts by weight of a plasticizer ("BENZOFLEX 9-88SG" manufactured by Eastman Chemical Company, diethylene glycol dibenzoate) were added to the mixture 1. Then, the obtained mixture was stirred for 15 minutes. Subsequently, 1 part by weight of a silane coupling agent ("KBM-803" manufactured by Shin-Etsu Chemical Co., Ltd., 3-mercaptopropyltrimethoxysilane), and 0.6 part by weight of a curing agent ("NY-260A" manufactured by Mitsubishi Chemical Corporation) were added. Then, the product was stirred for 15 minutes to obtain a coating liquid for the second adhesive layer.

The above-described coating liquid was applied onto a sheet-shaped polyethylene terephthalate separator film ("HY-US20" manufactured by Higashiyama Film Co., Ltd., thickness 50 μm) and heated in an oven (80° C., for five minutes) to form the second adhesive layer (refractive index 1.64) having a thickness of 5 μm. Accordingly, a multilayer film B including the separator film layer and the second adhesive layer was obtained.

(1-3. Manufacture of Optical Layered Body)

The first adhesive layer of the multilayer film A and the second adhesive layer of the multilayer film B were bonded together. Then, the laminate was stored in a constant temperature and humidity chamber at a temperature of 50° C. and a humidity of 60% R.H. for 48 hours. Accordingly, an optical layered body which includes the separator film layer, the second adhesive layer, the first adhesive layer, and the film substrate, in this order, was obtained.

(1-4. Measurement of Initial Adhesion)

The optical layered body was punched into 1 cm in width×12 cm in length. The separator film layer was peeled off from the punched optical layered body, and the exposed second adhesive layer was bonded to a non-alkali glass plate ("Eagle XG" manufactured by Corning Incorporated, 1.1 mm in thickness×25 mm in width×100 mm in length) using a rubber roller. Accordingly, a sample including the glass plate, the second adhesive layer, the first adhesive layer, and the film substrate, in this order, was obtained. Three samples were prepared in this manner.

The above-described sample was placed in a plastic box, and stored for 24 hours at room temperature. After that, the sample was taken out of the box, and measured for peel strength [N/cm] when the second adhesive layer was pulled and peeled from the glass plate toward a 90° direction (that is, a normal direction to the surface of the glass plate) using a load measuring device ("LTS-50N-S100" manufactured by Minebea Co., Ltd.). Then, an average value of the peel strength for three samples was taken as initial adhesion [N/cm].

The conditions for measuring peel strength were set as follows.

Peeling rate: 20 mm/min.

Measurement section: section from, as a starting point, 5 mm after a first local maximum point (automatically recognized by a measuring device), to 25 mm.

Analysis method: An average value of local maximum values and local minimum values in the above-described measurement section was defined as peel strength of the sample.

(1-5. Measurement of Adhesion after Moisture and Heat Resistance Test)

The above-described optical layered body was stored in a constant temperature and humidity chamber at a temperature of 60° C. and a humidity of 90% R.H. for 500 hours. Then, the optical layered body was taken out of the constant temperature and humidity chamber. Using the optical layered body thus taken out, preparation of three samples each including the glass plate, the second adhesive layer, the first adhesive layer and the film substrate in this order, and measurement of peel strength [N/cm] when the second adhesive layer was peeled off from the glass plate were carried out by the same methods as those in the above-described step (1-4). Then, an average value of the peel strength for three samples was taken as adhesion [N/cm] after the heat resistance test.

(1-6. Evaluation by Simulation)

Optical simulation for evaluating a surface light source device that would be manufactured with the optical layered body manufactured in the above-described Example 1 was performed as to light extraction efficiency and color unevenness using a program (program name: LightTools, manufactured by Synopsys Inc.). The conditions for the simulation were as follows.

Figure 3:
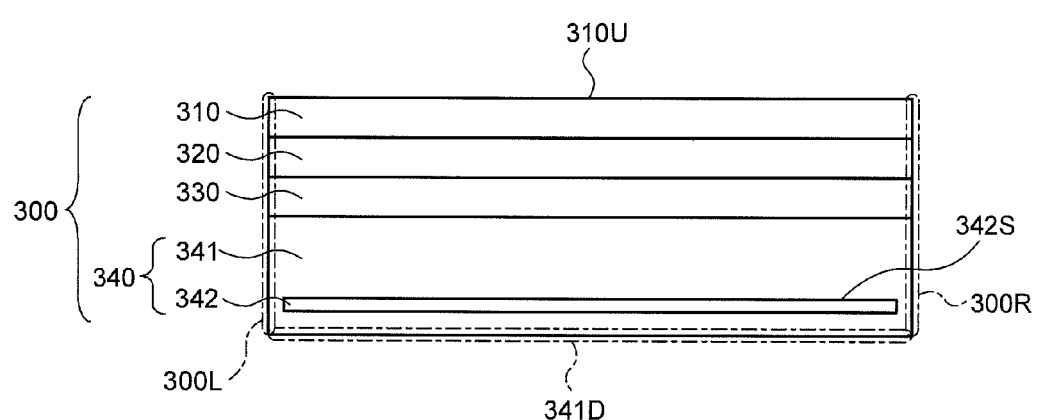
FIG. 3 is a cross-sectional view schematically illustrating a structure of a surface light source device developed as a model in simulation of Example 1.

FIG. 3 is a cross-sectional view schematically illustrating a structure of a surface light source device 300 developed as a model in the simulation of Example 1. As illustrated in FIG. 3, the surface light source device 300 developed as a model in the simulation included an optical functional layer 310, a first adhesive layer 320, a second adhesive layer 330, and an organic EL element 340 in this order from a light exit surface 310U. The first adhesive layer 320 and the second adhesive layer 330 were set to have the structures manufactured in the above-described Example 1. This surface light source device 300 developed as a model in the simulation did not include a film substrate between the first adhesive layer 320 and the optical functional layer 310. However, absence of the film substrate does not have a significant influence on the evaluation for light extraction efficiency and color unevenness.

The optical functional layer 310 had a concavo-convex structure including a plurality of concave portions (not shown in FIG. 3) on the entire light exit surface 310U. The shape of the concave portion was a square pyramid shape. The angle formed between the inclined surface of the square pyramid-shaped concave portion and the light exit surface was 60'; the length of the base edge of the square pyramid was 16 μm; and the distance between adjacent concave portions was 4 μm. As a result, the periodic pitch was 20 μm.

The refractive index of the optical functional layer 310 was 1.54.

The thickness of the optical functional layer 310 was 12.12 μm.

The organic EL element 340 included a glass substrate 341 as a light-transmissive substrate and a light-emitting layer 342 disposed inside the glass substrate 341. The light-emitting layer 342 was disposed in a position such that the distance from a surface 341D on an opposite side to the second adhesive layer 330 of the glass substrate 341 to the light-emitting layer 342 was 50 μm. The structures of these layers were set as follows.

Glass substrate 341: refractive index 1.64, thickness 700 μm.

Light-emitting layer 342: refractive index 1.516, thickness 50 μm.

In this surface light source device 300, the surface 341D on the opposite side to the second adhesive layer 330 of the glass substrate 341 was set to have a reflectivity of 85% and an absorptivity of 15%. The mode of reflection on the surface 341D was set to be specular reflection.

The entire interface 342S between the glass substrate 341 and the light-emitting layer 342 was set to have transmittance of 100%.

Furthermore, both side surfaces 300R and 300L of the surface light source device 300 were set to have reflectivity of 100%. The mode of reflection on the side surfaces 300R and 300L was set to be specular reflection.

In the above-described model, a light extraction amount L(1) when the light-emitting layer emitted light was calculated. In a model including only the organic EL element without the adhesive layer and the optical functional layer, a light extraction amount L(0) when the light-emitting layer emitted light was separately calculated. On the basis of these values, light extraction efficiency Q=light extraction amount L(1)/light extraction amount L(0) was obtained. Larger amount of this value is indicative of higher light extraction efficiency that results in better performance.

In the above-described model, values xθ and yθ of the chromaticity coordinate (x,y) at a polar angle θ when the light-emitting layer emitted light was calculated for a polar angle of 0° to 60°. On the basis of the values xθ and yθ of the chromaticity coordinate (x,y) at an angle of θ, and the values x0 and y0 of the chromaticity coordinate (x,y) at a polar angle of 0°, the square root of $(x\theta-x0)^2+(y\theta-y0)^2$ was calculated, and a maximum value thereof was obtained as D(1).

When the light-emitting layer emitted light in the model including only the organic EL element without the adhesive layer and the optical functional layer, the square root of $(x\theta-x0)^2+(y\theta-y0)^2$ was separately calculated, and a maximum value thereof was obtained as D(0).

Then, on the basis of these values, color unevenness index value Δxy=D(1)/D(0) was obtained. Smaller amount of this value is indicative of smaller color unevenness that results in better performance.

Comparative Example 1

(C1-1. Manufacture of Optical Layered Body)

The same coating liquid for a first adhesive layer as that in Example 1 was applied onto a sheet-shaped polyethylene terephthalate film substrate ("U34" manufactured by Toray Industries, Inc., thickness 100 μm) and heated in an oven to form a first adhesive layer (refractive index 1.48) having a thickness of 42 μm. To this first adhesive layer, a sheet-shaped polyethylene terephthalate separator film layer ("HY-US20" manufactured by Higashiyama Film Co., Ltd., thickness 50 μm) was bonded. Then, the laminate was stored in a constant temperature and humidity chamber at a temperature of 50° C. and a humidity of 60% R.H. for 48 hours. Accordingly, an optical layered body which includes the separator film layer, the first adhesive layer, and the film substrate, in this order, was obtained.

(C1-2. Measurement of Initial Adhesion)

The optical layered body was punched into 1 cm in width×12 cm in length. The separator film layer was peeled off from the punched optical layered body, and the exposed first adhesive layer was bonded to a non-alkali glass plate ("Eagle XG" manufactured by Corning Incorporated, 1.1 mm in thickness×25 mm in width×100 mm in length) using a rubber roller. Accordingly, a sample which includes the glass plate, the first adhesive layer, and the film substrate, in this order, was obtained. Three samples were prepared in this manner.

The above-described samples were placed in a plastic box, and stored for 24 hours at room temperature. After that, the sample was taken out of the box, and then measured for peel strength [N/cm] when the first adhesive layer was peeled off from the glass plate, under the same measurement conditions as those in step (1-4) of Example 1. Then, an average value of the peel strength for three samples was taken as adhesion [N/cm].

(C1-3. Measurement of Adhesion after Moisture and Heat Resistance Test)

The above-described optical layered body was stored in a constant temperature and humidity chamber at a temperature of 60° C. and a humidity of 90% R.H. for 500 hours. Then, the optical layered body was taken out of the constant temperature and humidity chamber. Using the optical layered body thus taken out, preparation of three samples each including the glass plate, the first adhesive layer and the film substrate in this order, and measurement of peel strength [N/cm] when the first adhesive layer was peeled off from the glass plate were carried out by the same methods as those in the above-described step (C1-2). Then, an average value of the peel strength for three samples was taken as adhesion [N/cm] after heat resistance test.

(C1-4. Evaluation by Simulation)

Light extraction efficiency Q and color unevenness index value Δxy were calculated in the same manner as in step (1-6) of Example 1, except that a surface light source device model including only the first adhesive layer according to Comparative Example 1 was used in place of the first adhesive layer 320 and the second adhesive layer 330.

Comparative Example 2

(C2-1. Manufacture of Optical Layered Body)

The same coating liquid for a second adhesive layer as that in Example 1 was applied onto a sheet-shaped polyethylene terephthalate film substrate ("U34" manufactured by Toray Industries, Inc., thickness 100 μm) and heated in an oven (80° C., for five minutes) to form a second adhesive layer (refractive index 1.64) having a thickness of 5 μm. To this second adhesive layer, a sheet-shaped polyethylene terephthalate separator film layer ("HY-US20" manufactured by Higashiyama Film Co., Ltd., thickness 50 μm) was bonded. Then, the laminate was stored in a constant temperature and humidity chamber at a temperature of 50° C. and a humidity of 60% R.H. for 48 hours. Accordingly, an optical layered body which includes the separator film layer, the second adhesive layer, and the film substrate, in this order, was obtained.

(C2-2. Measurement of Initial Adhesion)

The optical layered body was punched into 1 cm in width×12 cm in length. The separator film layer was peeled off from the punched optical layered body, and the exposed second adhesive layer was bonded to a non-alkali glass plate ("Eagle XG" manufactured by Corning Incorporated, 1.1 mm in thickness×25 mm in width×100 mm in length) using a rubber roller. Accordingly, a sample which includes the glass plate, the second adhesive layer, and the film substrate, in this order, was obtained. Three samples were prepared in this manner.

The above-described samples were placed in a plastic box, and stored for 24 hours at room temperature. After that, the sample was taken out of the box, and then measured for peel strength [N/cm] when the second adhesive layer was peeled off from the glass plate, under the same measurement conditions as those in step (1-4) of Example 1. Then, an average value of the peel strength for three samples was taken as adhesion [N/cm].

(C2-3. Measurement of Adhesion after Moisture and Heat Resistance Test)

The above-described optical layered body was stored in a constant temperature and humidity chamber at a temperature of 60° C. and a humidity of 90% R.H. for 500 hours. Then, the optical layered body was taken out of the constant temperature and humidity chamber. Using the optical layered body thus taken out, preparation of tree samples each including the glass plate, the second adhesive layer and the film substrate in this order, and measurement of peel strength [N/cm] when the second adhesive layer was peeled off from the glass plate were carried out by the same methods as those in the above-described step (C2-2). Then, an average value of the peel strength for three samples was taken as adhesion [N/cm].

(C2-4. Evaluation by Simulation)

Light extraction efficiency Q and color unevenness index value Δxy were calculated in the same manner as in step (1-6) of Example 1, except that a surface light source device model including only the second adhesive layer according to Comparative Example 2 was used in place of the first adhesive layer 320 and the second adhesive layer 330.

[Results]

The results of the above-described Example and Comparative Examples are shown in the following Table 1. In Table 1, the results of evaluation on only the organic EL element without having the adhesive layer and the optical functional layer are also shown as Reference Example 1. Each of the numerical values in the column of preservation stability in the following Table 1 is a value obtained by dividing the adhesion after moisture and heat resistance test by the initial adhesion.

[Table 1]

TABLE 1

Results of Example and Comparative Examples

| | Light Extraction Efficiency Q | Color Unevenness Δxy | Adhesion [N/cm] | Preservation Stability |
|---|---|---|---|---|
| Reference Example 1 | 100% | 100% | — | — |
| Comparative Example 1 | 158% | 33% | 2.82 | 105.9% |
| Comparative Example 2 | 192% | 42% | 0.29 | 18.2% |
| Example 1 | 191% | 34% | 2.02 | 75.4% |

[Discussion]

Light extraction efficiency is higher in Example 1 than in Comparative Example 1. This demonstrates that the present invention can achieve a surface light source device having high light extraction efficiency. Considering the fact that high light extraction efficiency is also obtained in Comparative Example 2, one cause of such high light extraction efficiency is considered that the higher refractive index of the second adhesive layer than the refractive index of the glass substrate of the organic EL element enabled reduction in reflection at an interface between the glass substrate and the second adhesive layer.

Color unevenness can also be suppressed in Example 1. This demonstrates that the present invention can usually suppress the color unevenness of the surface light source device. Δxy of Comparative Example 1 has a lower value than Δxy of Example 1. It is considered that this is because, in the surface light source device where the organic EL element and the optical functional layer are bonded together with only the first adhesive layer having a low refractive index as in Comparative Example 1, only light entering an interface between the glass substrate and the first adhesive layer at a small incident angle can pass through the interface, thereby reducing the distribution of the light that exits from the surface light source device and suppressing color unevenness. In contrast to this, in the surface light source device where the second adhesive layer having a large refractive index is bonded to the glass substrate as in Example 1, even light entering an interface between the glass substrate and the second adhesive layer at a large incident angle can pass through the interface. Therefore, in such a surface light source device, distribution of light exiting from the surface light source device becomes large, causing color unevenness to be likely to increase. However, in Example 1, the color unevenness can be reduced to an extent that is comparable to Comparative Example 1, and therefore there is technological significance in terms of achieving a balance between the improvement of light extraction efficiency and the suppression of color unevenness.

Furthermore, in Example 1, high adhesion is obtained. This demonstrates that the second adhesive layer of the optical layered body according to the present invention can be bonded to the organic EL element with high adhesion. Especially, the adhesion is dramatically higher in Example 1 than in Comparative Example 2 in which only the second adhesive layer is used. Therefore, it was found that, according to the present invention, the organic EL element and the optical functional layer can be bonded together with high adhesion.

It is noted that preservation stability is low in Comparative Example 2. This means that the adhesion of the second adhesive layer has decreased as time elapsed. Although a variety of causes of such reduction in adhesion are conceivable, inclusion of the plasticizer in the second adhesive layer is considered to be one of the causes. This plasticizer is used for some purposes one of which is to facilitate the peeling between the second adhesive layer and the separator film layer, but has had a problem that the above-described reduction in adhesion is caused. In contrast to this, preservation stability is increased in Example 1 than in Comparative Example 2. That is, in Example 1, reduction in adhesion of the second adhesive layer as time elapses can be suppressed. Although the reason why such an effect can be obtained is not identified, it is inferred that contribution by the first adhesive layer to the adhesion of the second adhesive layer increases, thereby reducing an influence on the change with time in properties of the second adhesive layer.

REFERENCE SIGNS LIST 100 optical layered body
110 substrate layer
120 first adhesive layer
130 second adhesive layer
200 surface light source device
210 organic EL element
211 light-transmissive substrate
212 first electrode layer
213 light-emitting layer
214 second electrode layer
215 sealing substrate
220 optical layered body
221 substrate layer
222 first adhesive layer
223 second adhesive layer
230 optical functional layer (concavo-convex structural layer)
231 concave portion
232 flat portion
233 inclined surface
300 surface light source device
310 optical functional layer
320 first adhesive layer
330 second adhesive layer
340 organic EL element
341 glass substrate
342 light-emitting layer

The invention claimed is:

1. A surface light source device comprising: an organic electroluminescent element; and an optical layered body, wherein
the optical layered body includes: a substrate layer; a first adhesive layer disposed on one surface of the substrate layer; and a second adhesive layer disposed on an opposite surface of the first adhesive layer to the substrate layer,
the surface light source device includes the organic electroluminescent element, the second adhesive layer, the first adhesive layer, and the substrate layer, in this order,
the second adhesive layer includes particles that are capable of scattering light, and
a refractive index $n1$ of the first adhesive layer and a refractive index $n2$ of the second adhesive layer satisfy $$1.40 \leq n1 \leq 1.50,$$

$$1.47 \leq n2 \leq 1.85, \text{ and}$$

$$0 < n2 - n1 \leq 0.45.$$

2. The surface light source device according to claim 1, wherein a thickness $d1$ of the first adhesive layer and a thickness $d2$ of the second adhesive layer satisfy $$0.1 \leq d2/d1 \leq 1.0.$$

3. The surface light source device according to claim 1, wherein the second adhesive layer includes particles that are capable of increasing a refractive index of the second adhesive layer.

4. The surface light source device according to claim 1, further comprising: an optical functional layer,
wherein the surface light source device includes the organic electroluminescent element, the second adhesive layer, the first adhesive layer, the substrate layer, and the optical functional layer, in this order.

5. The surface light source device according to claim 1, wherein the first adhesive layer has a thickness of 20 μm or more and 100 μm or less.

6. The surface light source device according to claim 1, wherein the particles that are capable of scattering light have a volume average particle diameter of 0.2 μm or more and 5 μm or less.

7. The surface light source device according to claim 1, wherein the amount of the particles that are capable of scattering light in the second adhesive layer is 0.5% by weight or more and 15% by weight or less.

8. The surface light source device according to claim 1, wherein a total thickness d1+d2 of the thickness d1 of the first adhesive layer and the thickness d2 of the second adhesive layer is 5 μm or more and less than 100 μm.

* * * * *